(12) United States Patent
Altice

(10) Patent No.: US 9,900,528 B2
(45) Date of Patent: *Feb. 20, 2018

(54) METHOD, APPARATUS AND SYSTEM PROVIDING A STORAGE GATE PIXEL WITH HIGH DYNAMIC RANGE

(71) Applicant: Micron Technology, Inc., Boise, ID (US)

(72) Inventor: Parker Altice, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,287

(22) Filed: Aug. 8, 2016

(65) Prior Publication Data

US 2017/0134676 A1   May 11, 2017

Related U.S. Application Data

(63) Continuation of application No. 14/089,225, filed on Nov. 25, 2013, now Pat. No. 9,412,779, which is a continuation of application No. 13/216,664, filed on Aug. 24, 2011, now Pat. No. 8,599,293, which is a continuation of application No. 11/511,310, filed on Aug. 29, 2006, now Pat. No. 8,026,966.

(51) Int. Cl.
| | |
|---|---|
| *H04N 5/355* | (2011.01) |
| *H01L 27/146* | (2006.01) |
| *H04N 5/374* | (2011.01) |
| *H04N 5/378* | (2011.01) |
| *H04N 5/359* | (2011.01) |
| *H04N 5/3745* | (2011.01) |

(52) U.S. Cl.
CPC ..... *H04N 5/3559* (2013.01); *H01L 27/14643* (2013.01); *H01L 27/14656* (2013.01); *H04N 5/3592* (2013.01); *H04N 5/35527* (2013.01); *H04N 5/35581* (2013.01); *H04N 5/374* (2013.01); *H04N 5/378* (2013.01); *H04N 5/37452* (2013.01)

(58) Field of Classification Search
CPC .... H04N 5/335; H04N 5/355; H04N 5/35527; H04N 5/35581; H04N 5/3559; H04N 5/374; H04N 5/37452; H04N 3/155; H04N 3/156; H01L 27/14643
See application file for complete search history.

(56) References Cited

U.S. PATENT DOCUMENTS

| | | | |
|---|---|---|---|
| 5,955,753 | A | 9/1999 | Takahashi |
| 6,107,655 | A | 8/2000 | Guidash et al. |
| 6,160,281 | A | 12/2000 | Guidash et al. |
| 6,218,656 | B1 | 4/2001 | Guidash et al. |
| 6,352,869 | B1 | 3/2002 | Guidash et al. |
| 6,423,994 | B1 | 7/2002 | Guidash et al. |
| 6,552,323 | B2 | 4/2003 | Guidash et al. |
| 6,657,665 | B1 | 12/2003 | Guidash et al. |

(Continued)

*Primary Examiner* — Nhan T Tran
*Assistant Examiner* — Chriss Yoder, III
(74) *Attorney, Agent, or Firm* — Perkins Coie LLP

(57) ABSTRACT

A method, apparatus and system are described providing a high dynamic range pixel. An integration period has multiple sub-integration periods during which charges are accumulated in a photosensor and repeatedly transferred to a storage node, where the charges are accumulated for later transfer to another storage node for output.

16 Claims, 7 Drawing Sheets

(56) References Cited

U.S. PATENT DOCUMENTS

| | | | |
|---|---|---|---|
| 6,778,212 B1 * | 8/2004 | Deng | H04N 5/235 |
| | | | 250/208.1 |
| 6,947,088 B2 | 9/2005 | Kochi et al. | |
| 7,242,429 B1 * | 7/2007 | Lee | H04N 5/3575 |
| | | | 348/296 |
| 7,332,786 B2 * | 2/2008 | Altice, Jr. | H01L 27/14609 |
| | | | 257/431 |
| 7,443,437 B2 * | 10/2008 | Altice, Jr. | H04N 5/363 |
| | | | 348/294 |
| 7,465,602 B2 * | 12/2008 | Altice, Jr. | H01L 27/14609 |
| | | | 257/E27.132 |
| 8,026,966 B2 | 9/2011 | Altice | |
| 8,599,293 B2 | 12/2013 | Altice | |
| 2005/0110093 A1 * | 5/2005 | Altice, Jr. | H01L 27/14609 |
| | | | 257/359 |
| 2006/0266925 A1 * | 11/2006 | Hopper | H01L 27/14609 |
| | | | 250/208.1 |

* cited by examiner

METHOD, APPARATUS AND SYSTEM PROVIDING A STORAGE GATE PIXEL WITH HIGH DYNAMIC RANGE

CROSS-REFERENCE TO RELATED APPLICATION(S)

This application is a continuation of U.S. application Ser. No. 14/089,225, filed Nov. 25, 2013, now U.S. Pat. No. 9,412,779, which is a continuation of U.S. application Ser. No. 13/216,664, filed Aug. 24, 2011, now U.S. Pat. No. 8,599,293, which is a continuation of U.S. application Ser. No. 11/511,310, now U.S. Pat. No. 8,026,966, each of which is incorporated herein by reference in their entirety.

TECHNICAL FIELD

The invention relates generally to imager devices, and more particularly to a pixel having increased dynamic range.

BACKGROUND

An imager, for example, a complementary metal oxide semiconductor (CMOS) imager, includes a focal plane array of pixels; each cell includes a photo-conversion device, for example, a photogate, photoconductor or a photodiode overlying a substrate for producing a photo-generated charge in a doped region of the substrate. A readout circuit is provided for each pixel and includes at least a source follower transistor and a row select transistor for coupling the source follower transistor to a column output line. The pixel also typically has a floating diffusion node, connected to the gate of the source follower transistor. Charge generated by the photo-conversion device is sent to the floating diffusion node. The imager may also include a transistor for transferring charge from the photo-conversion device to the floating diffusion node and another transistor for resetting the floating diffusion node to a predetermined charge level prior to charge transference.

FIG. 1 illustrates a block diagram of a CMOS imager device 208 having a pixel array 200 with each pixel being constructed as described above. Pixel array 200 comprises a plurality of pixels arranged in a predetermined number of columns and rows. The pixels of each row in array 200 are all turned on at the same time by a row select line, and the pixels of each column are selectively output by respective column select lines. A plurality of row and column lines are provided for the entire array 200. The row lines are selectively activated in sequence by the row driver 210 in response to row address decoder 220 and the column select lines are selectively activated in sequence for each row activated by the column driver 260 in response to column address decoder 270. Thus, a row and column address is provided for each pixel. The CMOS imager 208 is operated by the control circuit 250, which controls address decoders 220, 270 for selecting the appropriate row and column lines for pixel readout, and row and column driver circuitry 210, 260, which apply driving voltage to the drive transistors of the selected row and column lines. The pixel output signals typically include a pixel reset signal, Vrst, taken off the floating diffusion node when it is reset and a pixel image signal, Vsig, which is taken off the floating diffusion node after charges generated by an image are transferred to it. The Vrst and Vsig signals are read by a sample and hold circuit 265 and are subtracted by a differential amplifier 267 that produces a signal Vrst−Vsig for each pixel, which represents the amount of light impinging on the pixels. This difference signal is digitized by an analog to digital converter 275. The digitized pixel signals are then fed to an image processor 280 to form a digital image. The digitizing and image processing can be performed on or off the chip containing the pixel array.

Image sensors, such as an image sensor employing the conventional pixels described above, as well as sensors employing other pixel architectures, have a characteristic light dynamic range. Light dynamic range refers to the range of incident light that can be accommodated by an image sensor in a single frame of pixel data. It is desirable to have an image sensor with a high light dynamic range to image scenes that generate high light dynamic range incident signals, such as indoor rooms with windows to the outside, outdoor scenes with mixed shadows and bright sunshine, night-time scenes combining artificial lighting and shadows, and many others.

Image sensors also have a characteristic electrical dynamic range, commonly defined as the ratio of its largest non-saturating signal to the standard deviation of the noise under dark conditions. The electrical dynamic range is limited on an upper end by the charge saturation level of the sensor and on a lower end by noise imposed limitations and/or quantization limits of the analog to digital converter used to produce the digital image. When the light dynamic range of an image sensor is too small to accommodate the variations in light intensities of the imaged scene, e.g., by having a low light saturation level, the full range of the image scene is not reproduced. The illumination-voltage profile of the conventional pixel is typically linear, as shown in FIG. 2, which illustrates an illumination v. output voltage graph of a prior art pixel. A pixel's maximum voltage Vout-max may be reached at a relatively low level of illumination $I_{max-1}$ which causes the pixel to be easily saturated, thus limiting the dynamic range of the pixel.

When the incident light captured and converted into a charge by the photosensor during an integration period is greater than the capacity of the photosensor, excess charge may overflow and be transferred to adjacent pixels. This undesirable phenomenon is known as blooming, or charge cross talk, and results in a bright spot in the output image. Furthermore, the output of each cell in an array of image pixels may vary even under uniform illumination due to inherent variations in the physical makeup of each pixel, such as slight differences in threshold voltages of transistors. These differences cause additional defects in the output image referred to as fixed pattern noise.

Imager pixels, including CMOS imager pixels, typically have low signal-to-noise ratios and narrow dynamic range because of their inability to fully collect, transfer, and store the full extent of electric charge generated by the photosensitive area of the photo-conversion device. Since the amplitude of the electrical signals generated by any given pixel in a CMOS imager is very small, it is especially important for the signal-to-noise ratio and dynamic range of the pixel to be as high as possible. Generally speaking, these desired features are not attainable without additional devices that increase the size of the pixel. Therefore, there is a need for an improved pixel for use in an imager that provides high signal to noise ratio and high dynamic range while maintaining a small pixel size.

DETAILED DESCRIPTION

Figure 1:
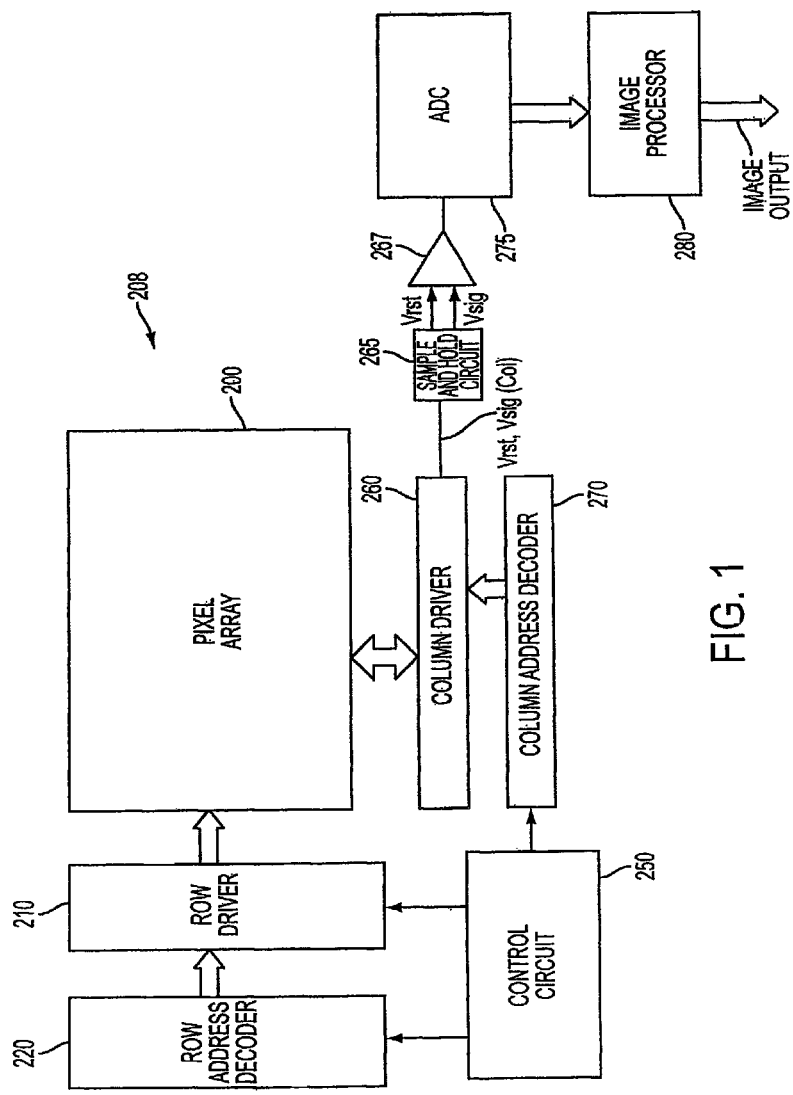
FIG. 1 is a block diagram of a conventional CMOS imager.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures, as well as insulating substrates, such as quartz or glass. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and other devices for converting electromagnetic radiation to an electrical signal. For purposes of illustration, a representative pixel is illustrated in the figures and description herein, and typically fabrication of all pixels in an image sensor will proceed simultaneously in a similar fashion.

Embodiments described herein relate to imager circuits and pixels which employ shutter gate transistors and associated storage regions. Such structures are shown, for example, in co-pending U.S. patent application Ser. Nos. 10/721,190 and 10/721,191, each assigned to Micron Technology, Inc. These patents are incorporated herein by reference.

Figure 3:
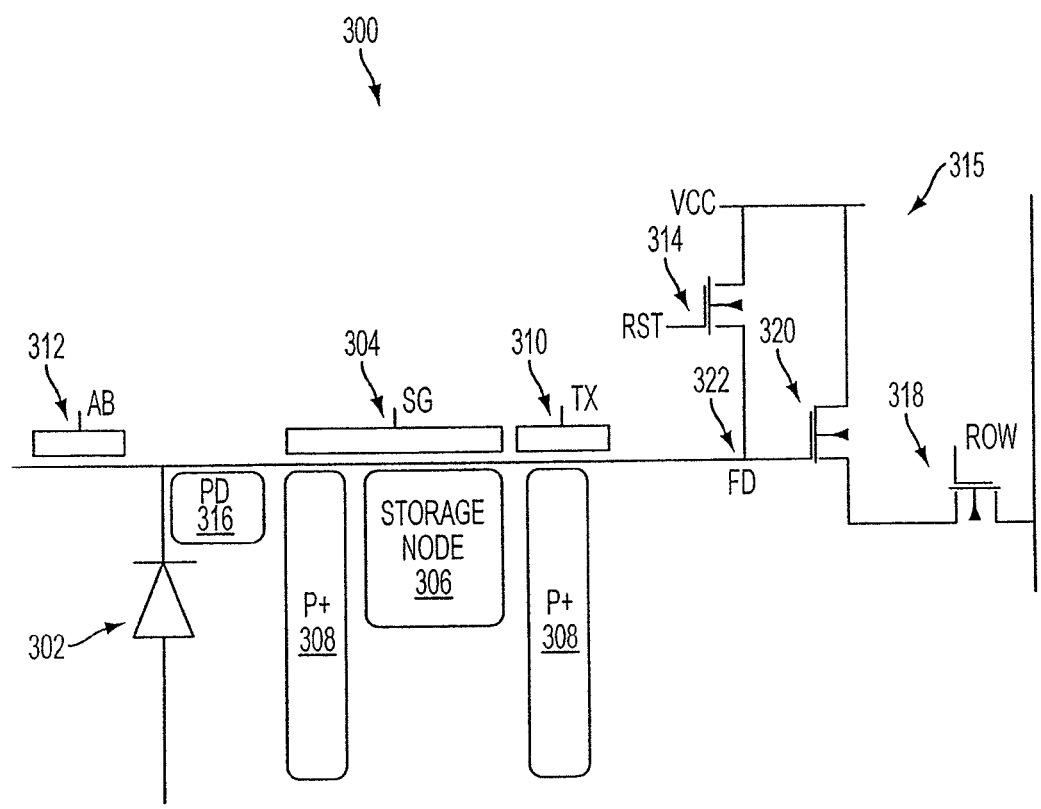
FIG. 3 is a schematic circuit diagram of a storage gate pixel with an anti-blooming gate according to an exemplary of the disclosure.

Referring now to the drawings, where like elements are designated by like reference numerals, FIG. 3 illustrates, partially as a representative semiconductor section and partially as an electrical schematic diagram, a circuit for a pixel 300 of a CMOS imager according to an embodiment. The pixel 300 includes a photosensor, e.g., a photodiode 302, shutter gate transistor 304, storage node 306, doped barrier regions 308, transfer gate transistor 310, anti-blooming transistor 312, floating diffusion node 322, and a reset and readout circuit 315 including reset transistor 314, source follower transistor 320 and row select transistor 318. PD 316 represents the charge capacity of the photodiode 302. The storage node 306 preferably has a charge storage capacity greater than that of the photodiode 302 charge capacity 316.

Figure 4:
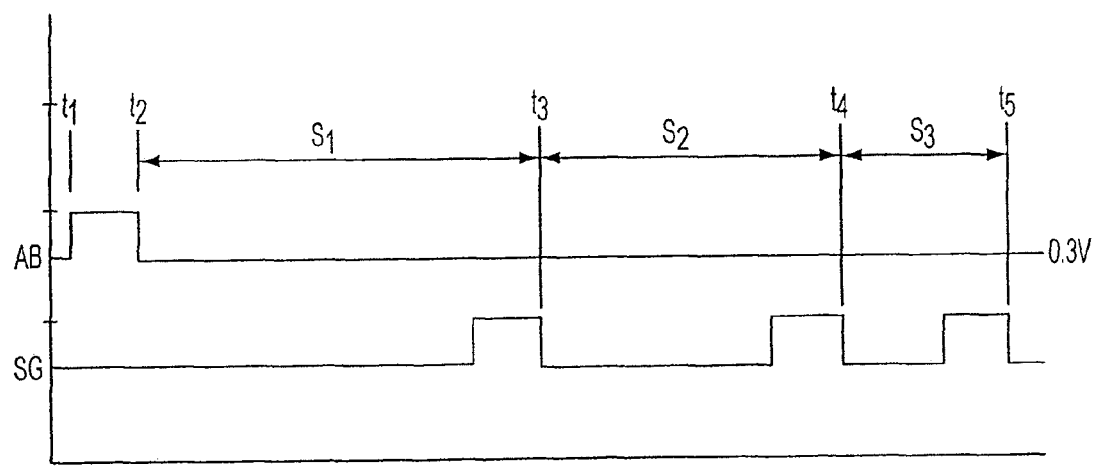
FIG. 4 is an integration period timing diagram in accordance with an embodiment of the disclosure.

FIG. 4 is a diagram showing a timing diagram of an integration period of the pixel 300 (FIG. 3) according to an embodiment. The photodiode 302 is reset by a pulse AB at the anti-blooming transistor gate at t1. Preferably, the AB signal level is dropped to a low positive voltage to operate as an anti-blooming gate at t2. As shown in FIG. 4, AB is held at a constant voltage of about 0.3V for the remainder of the integration period (t2-t5). The photodiode 302 generates charges that are accumulated and transferred to the storage node 306 via the storage gate 304 in multiple transfers. The charges are gathered in a series of sub-integration periods. The number of sub-integration periods may vary. FIG. 4 shows three sub-integration periods, $S_1$, $S_2$, and $S_3$, but more or fewer sub-integration periods may be used. At the end of each sub-integration period, the charge accumulated by the photodiode is transferred to the storage node by respective pulses SG applied to the storage gate. Since the gate voltage on the anti-blooming transistor is constant, the charge capacity 316 of the photodiode 302 remains (Vpin−VAB1)*CPD during the sub-integration periods $S_1$, $S_2$, and $S_3$. Accordingly, the storage node 306 may preferably have a charge storage capacity of at least about twice the charge storage capacity of the photodiode 302, though a lesser storage capacity for the storage node also may be employed.

The lengths of sub-integration periods $S_1$, $S_2$, and $S_3$ are determined by the timing of the SG pulses, and may be equal or different in duration. In the illustrated embodiment, the sub-integration period lengths decrease sequentially as shown in FIG. 4. The sub-integration periods could uniformly be equal or have sequentially increasing lengths.

Figure 5:
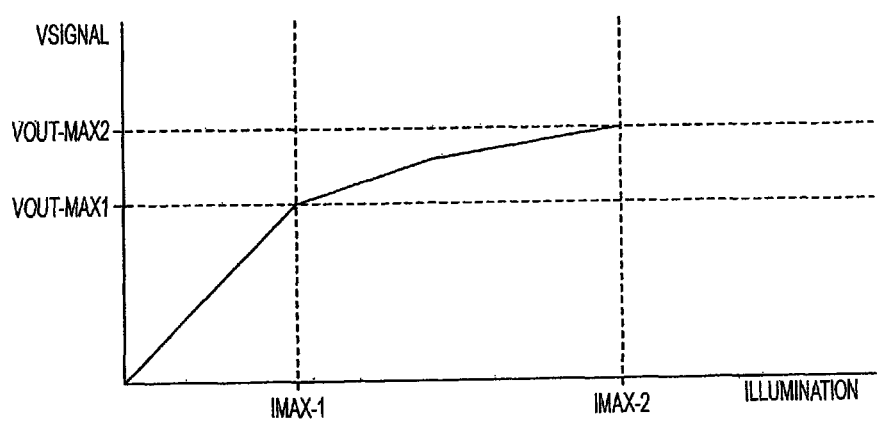
FIG. 5 is an illumination v. voltage graph of a pixel constructed in accordance with an embodiment of the disclosure.

FIG. 5 shows the illumination v. output signal graph resulting from the timing diagram illustrated in FIG. 4. The light dynamic range is increased from Imax-1 to Imax-2. The maximum output signal can be increased from Vout-max1 to Vout-max2 due to storage node 306 having sufficient capacity to store multiple charge transfers from photodiode 302.

As charge is being transferred from photodiode 302 to storage node 306, the floating diffusion node 322 is reset during the same integration frame for a correlated double sampling (CDS) operation. After the floating diffusion node 322 is reset, the reset condition of node 322 is applied to the gate of source follower transistor 320 for a reset readout through row select transistor 318. Once the charge transfers for sub-integration periods $S_1$, $S_2$, and $S_3$ are complete, the charge residing at storage node 306, i.e., the sum of all charges transferred from the photodiode 302 collected during the sub-integration periods $S_1$, $S_2$, and $S_3$, is transferred to the floating diffusion node 322 by the transfer gate 310. From the floating diffusion node 322 the charge is applied to the gate of source follower transistor 320 for readout through row select transistor 318.

Figure 2:
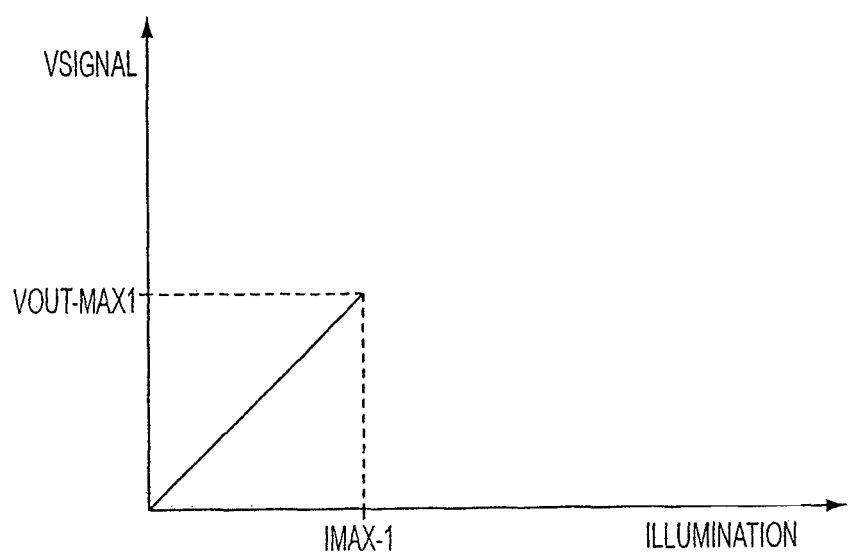
FIG. 2 is an illumination v. voltage graph of a conventional pixel.

The pixel illumination v. output signal graph of FIG. 5 is based on the timing diagram of FIG. 4. The slope of the line representing Vout, corresponds to the length of each sub-integration period. As the sub-integration periods $S_1$, $S_2$, and $S_3$ (in FIG. 4) subsequently shorten, the slope decreases at the respective illumination levels. In one operational embodiment, the varying lengths of sub-integration periods S1, S2, and S3 create angles, or "knees," in the illumination-voltage profile of the device and increase the dynamic range of the pixel, as shown in FIG. 5. Accordingly, the maximum saturation Imax-2 is reached at a greater level of illumination than that of the pixel of prior art, Imax-1, shown in FIG. 2.

Achieving a high dynamic range mode through multiple charge transfers while keeping a constant voltage on the gate of the anti-blooming transistor allows for a reduction in fixed pattern noise at the knee points. As the anti-blooming gate voltage is kept at a known constant for all pixels, deviations attributable to fixed pattern noise can be reliably determined and subtracted out in subsequent pixel signal processing through means known in the art, for example, using a processor which searches a lookup table.

Figure 6:
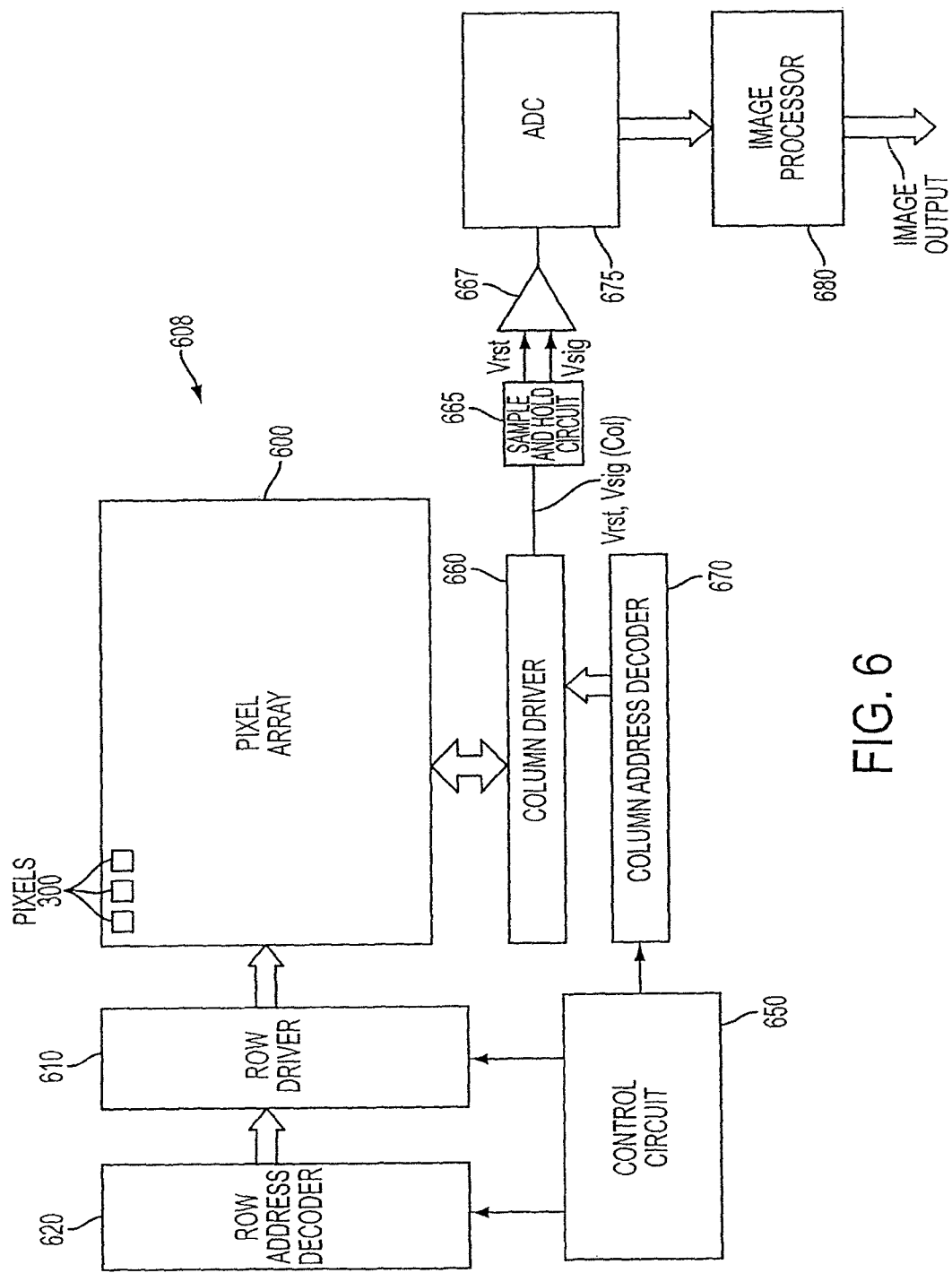
FIG. 6 is a block diagram of a CMOS imager incorporating at least one pixel constructed in accordance with an embodiment of the disclosure.

FIG. 6 illustrates a block diagram of a CMOS imager device 608 including a pixel array 600 having pixels 300 constructed according to one embodiment. The CMOS imager device 608 includes peripheral circuitry including sample and hold circuit 675, amplifier 667, analog to digital converter 675, image processor 680, column and row decoders 670,620, and column and row drivers 670,610, which operates substantially in accordance with the above description of CMOS imager device 208 (FIG. 1). The CMOS imager 608 is operated by the control circuit 650, which controls address decoders 620, 670 for selecting the appropriate row and column lines for pixel readout, row and column driver circuitry 610, 660, which apply driving voltage to the drive transistors of the selected row and column lines, and controls voltage application to pixel transistors (not shown) to achieve desired successive integration periods and charge transfers between storage and floating diffusion nodes. Control circuit 650 may also control application of voltage to the anti-blooming transistors (not shown).

Figure 7:
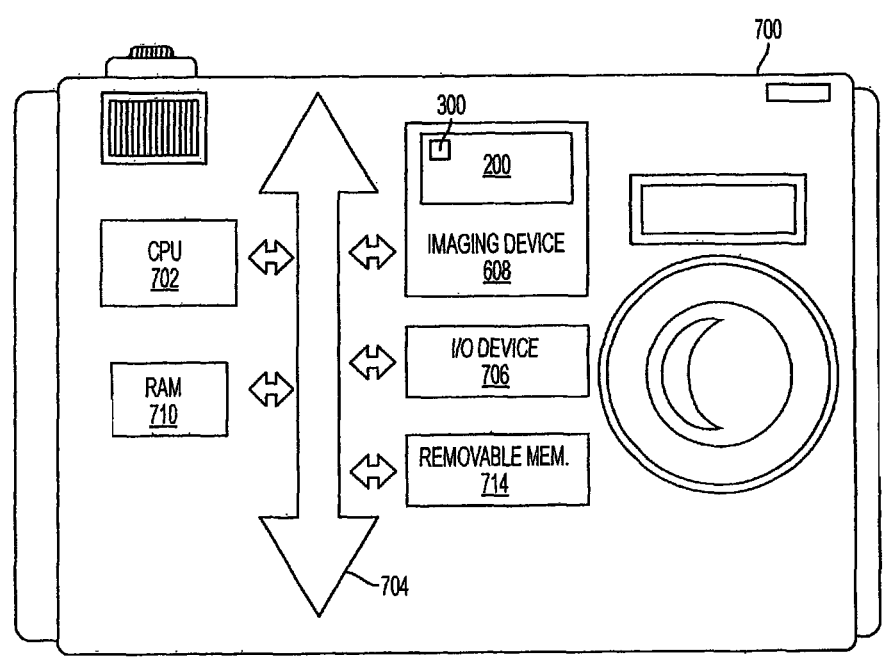
FIG. 7 is a processor system incorporating at least one imager device constructed in accordance with an embodiment of the disclosure.

FIG. 7 shows an image processor system 700, for example, a still or video digital camera system, which includes an imaging device 608 employing pixels 300 constructed in accordance with one embodiment. The imager device 608 may receive control or other data from system 700. System 700 includes a processor 702 having a central processing unit (CPU) that communicates with various devices over a bus 704. Some of the devices connected to the bus 704 provide communication into and out of the system 700; one or more input/output (I/O) devices 706 and imager device 808 are such communication devices. Other devices connected to the bus 704 provide memory, illustratively including a random access memory (RAM) 710, and one or more peripheral memory devices such as a removable memory drive 714. The imager device 608 may be constructed as shown in FIG. 6 with the pixel array 200 having pixels 300. The imager device 608 may, in turn, be coupled to processor 702 for image processing, or other image handling operations. Examples of processor based systems, which may employ the imager device 608, include, without limitation, computer systems, camera systems, scanners, machine vision systems, vehicle navigation systems, video telephones, surveillance systems, auto focus systems, star tracker systems, motion detection systems, image stabilization systems, and others.

It is again noted that the above description and drawings illustrate embodiments that achieve the objects, features, and advantages as may be provided by various embodiments of the present invention. It is not intended that the present invention be limited to the illustrated embodiments. Any modification of the present invention which comes within the spirit and scope of the following claims should be considered part of the present invention. Accordingly, the invention is not limited by the foregoing description or drawings, but is only limited by the scope of the appended claims.

I claim:

1. An imager circuit comprising:
   at least one pixel circuit, the at least one pixel circuit comprising—
      a photosensor having a charge storage capacity, the photosensor configured to accumulate charge,
      a first transistor connected to the photosensor for transferring charge from the photosensor,
      a storage node selectively coupled to the photosensor for receiving charge from the photosensor via the first transistor, the storage node having a charge storage capacity that is greater than the charge storage capacity of the photosensor, and
      a second transistor connected to the storage node for transferring charge from the storage node to a floating diffusion node; and
   a control circuit operably coupled to the first transistor, the control circuit configured to—
      define a plurality of successive integration periods during an image capture in which charges produced by the photosensor in each of the integration periods are successively stored and accumulated in the storage node, and
      operate the second transistor to transfer charges accumulated in the storage node for the integration periods to the floating diffusion region.

2. The circuit of claim 1 wherein the storage node has a storage capacity of at least about twice the storage capacity of the photosensor.

3. The circuit of claim 1, further comprising a readout circuit connected to the floating diffusion node to output a signal based on the charge stored at the floating diffusion node.

4. The circuit of claim 3 wherein the readout circuit further comprises:
   a reset transistor connected to the floating diffusion node for resetting the charge on the floating diffusion node;
   a source-follower transistor having a gate for receiving charge from the floating diffusion-node; and
   a row-select transistor connected to the source-follower transistor for outputting a signal produced by the source-follower transistor.

5. The circuit of claim 4, further comprising an anti-blooming transistor electrically connected to the photosensor for draining charge from the photosensor.

6. The circuit of claim 4 wherein the control circuit is operable to apply a constant voltage to a gate of the anti-blooming transistor during the plurality of successive integration periods.

7. An imaging device comprising:
   a pixel array comprising a plurality of pixels, wherein at least some of said pixels comprise—
      a photosensor having a charge storage capacity, the photosensor configured to accumulate charge,
      a first transistor connected to the photosensor for transferring charge from the photosensor,
      a storage node coupled to the photosensor for receiving charge from the photosensor via the first transistor, and
      a second transistor connected to the storage node for transferring charge from the storage node to a floating diffusion node; and
   a control circuit operably coupled to the first transistor, the control circuit configured to— define a plurality of successive integration periods during an image capture in which charges produced by the photosensor in each of the integration periods are successively stored and accumulated in the storage node, and transfer charges accumulated in the storage node for the integration periods to the floating diffusion region.

8. The imaging device of claim 7 wherein the storage node charge storage capacity is at least about twice the storage capacity of the photosensor.

9. The imaging device of claim 7, further comprising a readout circuit connected to the floating diffusion node to output a signal based on the charge accumulated at the floating diffusion region.

10. A processing system comprising:
an array of pixels, each of the pixels including a photosensor for generating charges;
a first transistor connected to the photosensor for transferring charge from the photosensor;
a storage node selectively coupled to the photosensor for receiving charge from the photosensor via the first transistor, the storage node having a charge storage capacity that is greater than a charge storage capacity of the photosensor;
a second transistor connected to the storage node for transferring charge from the storage node to a floating diffusion node; and
a control circuit operably coupled to the first transistor, the control circuit configured to—
define a plurality of successive integration periods during an image capture in which charges produced by the photosensor in each of the integration periods are successively stored and accumulated in the storage node, and
operate the second transistor to transfer charges accumulated in the storage node for the integration periods to the floating diffusion region.

11. The system of claim 10 wherein the storage node charge storage capacity is at least about twice the storage capacity of the photosensor.

12. The system of claim 11 wherein the readout circuit further comprises:
a reset transistor connected to the floating diffusion node for resetting the charge on the floating diffusion node;
a source-follower transistor having a gate for receiving charge from the floating diffusion node; and
a row-select transistor connected to the source-follower transistor for outputting a signal produced by the source-follower transistor.

13. The system of claim 12 further comprising an anti-blooming transistor electrically connected to the photosensor for draining charge from the photosensor.

14. The circuit of claim 12 wherein the control circuit is operable to apply a constant voltage to a gate of the anti-blooming transistor during the plurality of successive integration periods.

15. The system of claim 12 wherein the system is a camera processor system.

16. The system of claim 10 further comprising a readout circuit connected to the floating diffusion node to output a signal based on the charge accumulated at the floating diffusion gate.

* * * * *